(12) United States Patent
Busson et al.

(10) Patent No.: US 7,796,197 B2
(45) Date of Patent: *Sep. 14, 2010

(54) ELECTRONIC COMPONENT ALLOWING THE DECODING OF DIGITAL TERRESTRIAL OR CABLE TELEVISION SIGNALS

(75) Inventors: Pierre Busson, Grenoble (FR); Pierre-Oliver Jouffre, Grenoble (FR); Bruno Paille, Saint Aupre (FR)

(73) Assignee: STMicroelectronics S.A., Montrouge (FR)

( * ) Notice: Subject to any disclaimer, the term of this patent is extended or adjusted under 35 U.S.C. 154(b) by 1590 days.

This patent is subject to a terminal disclaimer.

(21) Appl. No.: 10/819,086

(22) Filed: Apr. 6, 2004

(65) Prior Publication Data

US 2004/0252245 A1    Dec. 16, 2004

(30) Foreign Application Priority Data

Apr. 11, 2003 (FR) .................................. 03 04555

(51) Int. Cl.
H04N 5/50 (2006.01)
H04N 5/44 (2006.01)
H04H 20/74 (2008.01)

(52) U.S. Cl. .................. 348/731; 348/725; 348/726; 455/3.02; 455/338; 455/339; 455/340; 725/131; 725/139; 725/151; 375/240.01

(58) Field of Classification Search ................. None
See application file for complete search history.

(56) References Cited

U.S. PATENT DOCUMENTS

| | | |
|---|---|---|
| 4,162,452 A | 7/1979 | Ash |
| 4,392,249 A | 7/1983 | Matsuura et al. |
| 4,885,801 A | 12/1989 | Hansen et al. |
| 4,894,657 A | 1/1990 | Hwang et al. |
| 5,109,544 A | 4/1992 | Mittel et al. |
| 5,220,164 A | 6/1993 | Lieber et al. |
| 5,307,515 A | 4/1994 | Kuo et al. |
| 5,329,319 A | 7/1994 | Sgrignoli |
| 5,450,621 A | 9/1995 | Kianush et al. |
| 5,487,186 A | 1/1996 | Scarpa |
| 5,517,529 A | 5/1996 | Stehlik |
| 5,671,220 A | 9/1997 | Tonomura |

(Continued)

FOREIGN PATENT DOCUMENTS

| | | |
|---|---|---|
| EP | 0 481 543 A1 | 4/1992 |
| EP | 1 104 097 | 5/2001 |
| FR | 2 824 986 A1 | 11/2002 |
| WO | WO 00/62532 | 10/2000 |

OTHER PUBLICATIONS

00672434; L. Tan; ISSCC 98/ Papaer FP 13.1; Feb. 6, 1998.*

(Continued)

*Primary Examiner*—Joseph P Hirl
*Assistant Examiner*—Fred Peng
(74) *Attorney, Agent, or Firm*—Gardere Wynne Sewell LLP (57) ABSTRACT

An integrated circuit includes a dual-conversion tuner, firstly upconverting so as to place a signal outside the reception band, then downconverting with zero intermediate frequency. A bulk acoustic wave type filter is calibrated in such a way as to accurately determine its central frequency. This filter is positioned between the two frequency transposition stages of the tuner. After baseband filtering, the signals are digitized then processed in a digital block BNM which includes a channel decoding module.

39 Claims, 4 Drawing Sheets

U.S. PATENT DOCUMENTS

| | | | |
|---|---|---|---|
| 5,737,035 A * | 4/1998 | Rotzoll | 348/725 |
| 5,752,179 A | 5/1998 | Dobrovolny | |
| 5,774,799 A | 6/1998 | Croft et al. | |
| 5,796,147 A | 8/1998 | Ono | |
| 5,825,833 A | 10/1998 | Sakaue et al. | |
| 5,857,004 A | 1/1999 | Abe et al. | |
| 5,953,636 A * | 9/1999 | Keate et al. | 455/3.02 |
| 6,031,878 A | 2/2000 | Tomasz et al. | |
| 6,101,369 A | 8/2000 | Takahashi et al. | |
| 6,131,023 A | 10/2000 | Matsuura | |
| 6,147,713 A | 11/2000 | Robbins et al. | |
| 6,275,990 B1 | 8/2001 | Dapper et al. | |
| 6,400,416 B1 * | 6/2002 | Tomasz | 348/654 |
| 6,424,074 B2 | 7/2002 | Nguyen | |
| 6,535,766 B1 | 3/2003 | Thompson et al. | |
| 6,549,766 B2 | 4/2003 | Vorenkamp et al. | |
| 6,603,807 B1 | 8/2003 | Yukutake et al. | |
| 6,714,776 B1 | 3/2004 | Birleson | |
| 6,813,484 B1 | 11/2004 | Tolson et al. | |
| 6,885,853 B2 * | 4/2005 | Sevens et al. | 455/255 |
| 6,952,594 B2 | 10/2005 | Hendin | |
| 6,983,136 B2 | 1/2006 | Mason et al. | |
| 7,039,385 B1 | 5/2006 | Hoffmann et al. | |
| 7,054,606 B1 | 5/2006 | Sheng et al. | |
| 7,098,757 B2 | 8/2006 | Avazi et al. | |
| 7,167,694 B2 | 1/2007 | Khoini-Poorfard et al. | |
| 7,177,615 B2 | 2/2007 | Ono et al. | |
| 2003/0053562 A1 | 3/2003 | Busson et al. | |
| 2005/0162040 A1 * | 7/2005 | Robert | 310/322 |
| 2006/0166639 A1 | 7/2006 | Kaiser et al. | |
| 2007/0182866 A1 * | 8/2007 | Birleson et al. | 348/725 |

OTHER PUBLICATIONS

French Search Report, FR 03 04555, dated Dec. 10, 2003.

Nguyen, C. T.-C., Micromechanical Resonators for Oscillators and Filters, 1995 IEEE Ultrasonics Symposium, Proceedings, Nov. 7, 1995, pp. 489-499, XP010157252.

Poulton, et al., "a 4GSample/s 8b ADC in 0.35um CMOS", ISSCC 2002, pp. 166-457, XP010585513.

Yamamoto, et al., "Wide Band and Low Supply Voltage ICs for Satellite Tuner Unit", Consumer Electronics, 1992, Digest of Technical Papers., ICCE., IEEE 1992, Internatinal Conference on Rosemont, Ilinois, USA Jun. 2-4, 1992, New York, NY, IEEE, Jun. 2, 1992, pp. 190-191, XP010102878.

\* cited by examiner

ELECTRONIC COMPONENT ALLOWING THE DECODING OF DIGITAL TERRESTRIAL OR CABLE TELEVISION SIGNALS

PRIORITY CLAIM

The present application claims priority from French Application for Patent No. 03 04555 filed Apr. 11, 2003, the disclosure of which is hereby incorporated by reference.

BACKGROUND OF THE INVENTION

1. Technical Field of the Invention

The present invention relates to the decoding of radiofrequency transmission channels conveying coded digital information.

The invention thus applies advantageously to digital terrestrial television, that is to say using signals transmitted between television antennas, as defined, for example, in the European DVB-T (Digital Video Broadcasting-terrestrial) or in the North-American ATSC (Advisory Committee on Advanced Television Service Digital TV) specification, or to digital cable television, as defined, for example, in the European DVB-C (Digital Video Broadcasting-cable) or in the North-American ITU-J83 Annex A/B/C/D (International Telecommunication Union) specification, all these telebroadcasts being based on the MPEG transmission standards, and use for example to convey information, quadrature digital modulation, or else modulation of the COFDM type according to terminology well known to the person skilled in the art.

The invention also relates in particular to tuners, and also to demodulators and to the actual channel decoding processing.

2. Description of Related Art

The television signals received at an input of a tuner of a receiver are composed of the entire set of channels transmitted that lie in the 45 MHz-860 MHz frequency band. The objective of the tuner is to select the desired channel and to output a baseband signal on the in-phase path (I path) and on the quadrature path (Q path). This signal is thereafter converted into a digital signal and demodulated. The channel decoding processing thereafter also comprises a block which distinguishes, typically by means of majority logic, zeros from ones, then performs all the error correction, that is to say typically a Viterbi decoding, the interleaving, Reed-Solomon decoding and deshuffling. The channel decoding device outputs packets that are decoded in a conventional manner in a source decoding device in accordance with the MPEG standards so as to regenerate the initial audio and video signals transmitted via antennas or via the cable.

Current studies are aimed at researching ever more integrated solutions for the embodiment of digital terrestrial or cable television receivers. However, this research hits technological difficulties related to the embodiment of the means making it possible, on the one hand, to correctly discern a channel from the entire set of channels present, and, on the other hand, to correctly discriminate the signal from noise. Specifically, whereas in digital satellite television, all the channels have nearly the same power, this is not the case in particular in digital terrestrial television. Thus, it is for example possible to have adjacent channels exhibiting a very high power with respect to the desired channel, for example a difference in power of the order of 40 dB. It is therefore necessary to be able to ensure rejection of 40 dB on the adjacent channels. Moreover, the specification imposes a signal/noise ratio of the order of 30 dB. Hence, in the worst case, it is therefore essential for it to be possible to bring the level of an adjacent channel to 70 dB below its input level. This results in extremely significant constraints on the filters, this being extremely constraining in respect of integrated solutions.

There is accordingly a need for a solution to this problem.

There is also a need for a totally integrated solution, given the characteristics of digital television signals, in particular terrestrial ones, exhibiting more significant rejection constraints than digital cable television signals.

SUMMARY OF THE INVENTION

An embodiment of the invention therefore proposes an electronic component comprising an integrated circuit embodied on a monolithic substrate and comprising:

a tuning module or tuner of the zero intermediate frequency dual uplink then downlink type, possessing an input able to receive digital terrestrial or cable television analog signals composed of several channels, a bandpass filter of the bulk acoustic wave type disposed between the two frequency transposition stages of the tuning module, and delivering a filtered analog signal containing the information conveyed by a desired channel and so-called adjacent channels information, a baseband filtering stage disposed on the two quadrature output paths of the second frequency transposition stage for performing a first filtering of the adjacent channels information, a multibit analog/digital conversion stage linked to the output of the baseband filtering stage, a digital block comprising a stage for correcting the defects of phase-and amplitude-pairing of the two processing paths, and a channel decoding digital module linked to the output of the defects correcting stage, this decoding digital module comprising a demodulation stage, a digital filtering stage for eliminating the said adjacent channels information, and an error correcting stage for delivering a stream of data packets corresponding to the information conveyed by the desired channel, and means for determining the central frequency of the bulk acoustic wave filter.

Stated otherwise, an embodiment of the invention solves in particular the problem of the filtering of the adjacent channels using in combination, an integrated filter of the bulk acoustic wave type ("BAW" filter), an integrated baseband filter, and a digital filter. Thus, the bulk acoustic wave filter performs a prefiltering of the signal so as to allow through only the desired channel and a few adjacent channels. Then, the elimination of the adjacent channels proceeds with the baseband analog filter which is a relatively soft filter, and terminates with the digital filter (Nyquist filter) on output from which the adjacent channels information is eliminated.

Moreover, the multibit resolution of the analog/digital conversion stage, for example at least equal to four bits, allows sufficient accuracy to be obtained ultimately with regard to the information of the desired channel.

Thus, the distributing of the adjacent channels filtering function according to the invention helps to allow the embodiment on one and the same chip, of all the components of the receiver.

Moreover, it is known that the central frequency of a bulk acoustic wave filter, which in practice consists for example of at least two resonators of the bulk acoustic wave type, is difficult to control accurately on the basis of the physical characteristics of the resonators. This problem which a priori renders the use of an integrated filter of the BAW type incompatible in a tuner, is solved according to the invention by an in-situ explicit determination of the central frequency of the filter.

The channels of television signals extend over a predetermined frequency span, typically 45 MHz-860 MHz.

And according to one embodiment of the invention, the means for determining this central frequency comprise means which are able, in the absence of the signal at the input of the first transposition stage, to vary beyond the upper limit of the said frequency span, the frequency of a calibration transposition signal applied to this transposition stage, and detection means able to determine for each value of the frequency of the calibration signal, the power of the signal at the output of the bulk acoustic wave filter and to detect the maximum power, the central frequency of the filter then being the frequency of the calibration signal corresponding to this maximum value of power.

This said, the invention is not limited to this particular method of determining the central frequency.

According to one embodiment of the invention, after the calibration phase, the first frequency transposition stage is able to receive a first transposition signal having a frequency equal for example to the sum of the frequency of the desired channel and of the said determined central frequency of the bulk acoustic wave filter. By way of indication, a possible value for this central frequency is 1220 MHz.

This said, it could also be possible for the frequency of the first transposition signal to be equal to the difference between the said central frequency and the frequency of the desired channel.

Choosing a transposition frequency of the first transposition signal greater than the upper limit of the frequency span, that is to say greater than 860 MHz, makes it possible to go with this upconversion, outside the reception band, and thus to avoid interactions with the first transposition frequency.

Moreover, the second frequency transposition stage, that is to say the one that will bring the signal back to baseband, is able to receive a second transposition signal having the said determined central frequency of the BAW type filter, that is to say in this instance 1220 MHz.

The passband of the bulk acoustic wave filter is for example of the order of two to three times the frequency width of a channel. Thus, by way of indication, the frequency width of a channel being of the order of 8 MHz, it will be possible to choose a passband of the order of 20 MHz for the bulk acoustic wave filter.

For its part, the bandpass filtering stage possesses an upper cutoff frequency of around 20% greater than the frequency half-width of a channel.

Moreover, although the sampling frequency of the analog/digital conversion stage is advantageously greater than around 2.5 times the upper cutoff frequency of the baseband filtering stage, it is particularly advantageous to provide a much higher sampling frequency, for example of the order of some 100 MHz and more generally at least ten times greater than the upper cutoff frequency of the baseband filtering stage, so as to perform an oversampling of the signal. Thus, this oversampling, in combination with a multibit resolution, makes it possible, in particular when a decimator filter is disposed downstream of the analog/digital converter, to extract the desired channel with a multibit resolution, and hence to be able to correctly utilize the information contained in this desired channel.

According to one embodiment of the invention, the cutoff frequency of the digital filtering stage is equal to the frequency half-width of a channel.

According to one embodiment of the invention, the component comprises a metal plate glued to the rear surface of the substrate by a conducting glue, this metal plate being intended to be grounded. Thus, the capacitance, of relatively high value, produced between the semiconductor substrate and the metal plate, makes it possible to absorb the high-frequency current spikes.

Moreover, it is particularly advantageous for the elements performing a digital processing to be disposed in a part of the substrate that is insulated from the remaining part of the substrate by a semiconducting barrier having a type of conductivity different from the type of conductivity of the substrate. Stated otherwise, a so-called "triple well" technology is used. This makes it possible, when the semiconducting barrier is biased by a bias voltage different from that supplying the transistors situated in the insulated part of the substrate, to prevent noise on the supply voltage of the transistors from being transmitted directly via the substrate to the various analog components of the receiver.

The subject of the invention is also a terrestrial or cable digital television signals receiver, comprising an electronic component as defined hereinabove.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
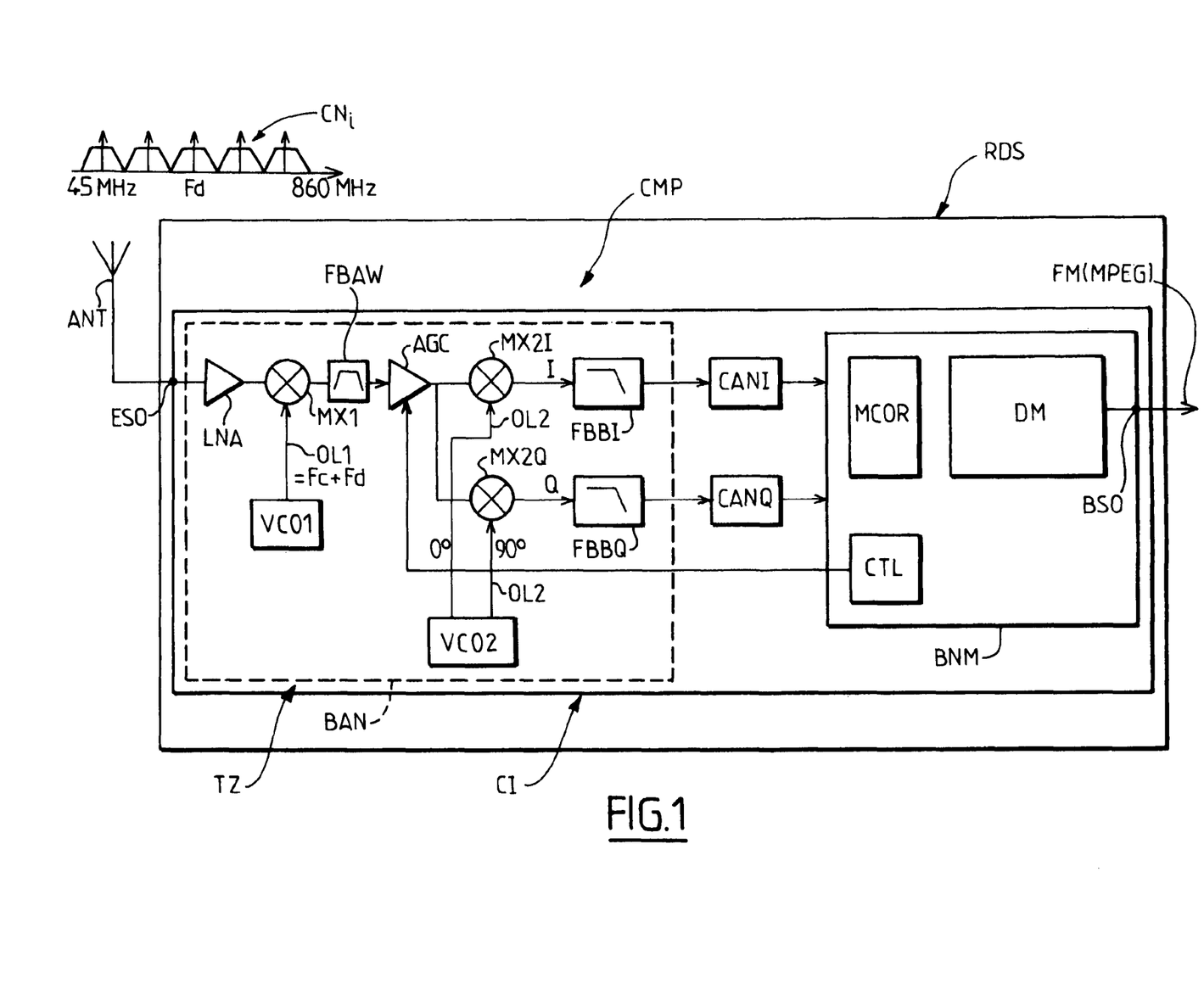
FIG. 1 is a schematic of the internal structure of an electronic component according to the invention.

In FIG. 1, the reference RDS denotes a receiver/decoder connected to a antenna ANT picking up digital terrestrial television signals, this receiver being intended to receive and to decode these signals. The receiver RDS comprises at the head end an electronic component CMP intended to receive all the channels $CN_i$ present in the signal received at the signal input ESO of this component, and to deliver, at the output BSO, an MPEG data stream corresponding to a selected channel.

The component CMP comprises an integrated circuit IC (chip) embodied entirely in CMOS technology on a monolithic silicon substrate. The component CMP comprises at the head end a tuning device or "tuner" TZ, intended for selecting a channel from among all the channels $CN_i$ present in the signal received at the signal input ESO which is also here the input of the tuner. This tuner TZ is here a dual-conversion tuner, firstly upconversion then downconversion with zero intermediate frequency, so as to ultimately bring the signal back to baseband. More precisely, the tuner TZ comprises an analog block BAN, separated from a digital block BNM by an analog/digital conversion stage CANI and CANQ.

The tuner TZ comprises at the head end a low noise amplifier LNA connected to the signal input ESO. This amplifier LNA is followed by a first frequency transposition stage (mixer) MX1. This mixer MX1 receives, on the one hand, the signal emanating from the low noise amplifier LNA and, on the other hand, a transposition signal OL1 emanating for example from a voltage-controlled oscillator VCO1.

During normal operation, this transposition signal OL1 has a frequency preferably equal to the sum of the frequency Fd of the desired channel and of the central frequency Fc of an integrated bandpass filter of the bulk acoustic wave type FBAW disposed downstream of the mixer MX1. Filters of the bulk acoustic wave type are known per se to the person skilled in the art. They are, for example, formed of at least two resonators of the bulk acoustic wave type, also sometimes referred to loosely as a piezoelectric resonator. Such resonators are, for example, described in the article by Sang Hee Kim et al. entitled "AIN-Based Film Bulk Acoustic Resonator Devices With W/SiO2 Multilayers Reflector for RF Band Pass Filter Application", J. Vac. Sci. Technol. B 19(4), July/August 2001, or else in the article by K. M. Lakin entitled "Thin Film Resonators and Filters", 1999 IEEE ULTRASONICS SYMPOSIUM, p. 895 906. Moreover, the latter article illustrates the embodying of filters of the BAW type, formed of several resonators disposed as a ladder.

The central frequency of the integrated filter FBAW is not defined accurately on the basis solely of the technological characteristics and dimensioning of the resonators. Only the bandwidth of the filter is well defined. Hence the invention provides for means of determination able to determine this central frequency during a calibration phase.

Figure 2:
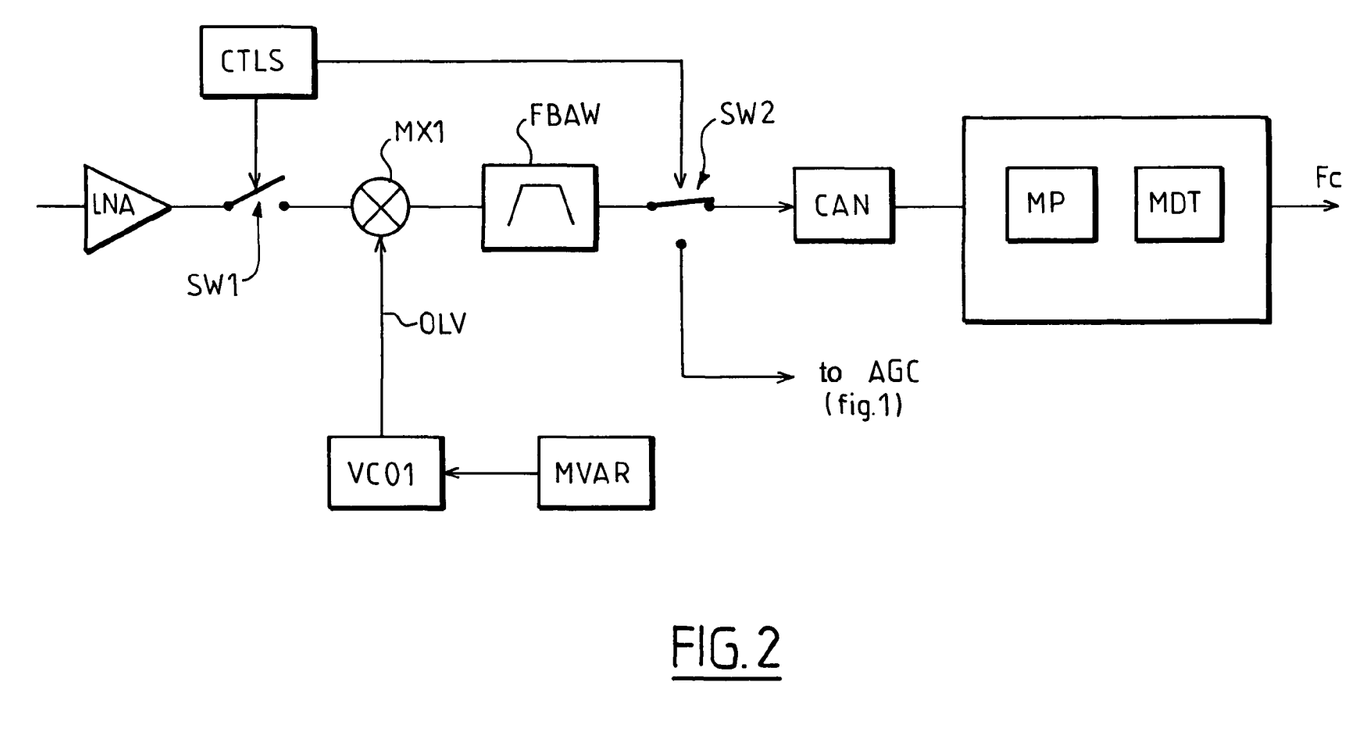
FIG. 2 more particularly relates to a phase of calibration according to the invention of the central frequency of a filter of the bulk acoustic wave type.

More precisely, according to an exemplary embodiment illustrated in FIG. 2, the means of determination of this central frequency comprise control means CTLS able to control a first breaker SW1 disposed between the output of the amplifier LNA and the input of the mixer MX1, and a second breaker SW2 connected downstream of the filter FBAW. In the calibration phase the first breaker SW1 is open (FIG. 2), whereas in the phase of normal operation it is closed (FIG. 1). Stated otherwise, in the calibration phase there is an absence of signal at the input of the first transposition stage MX1, whereas the signal received by the antenna is present at the input of the first transposition stage MX1 in the phase of normal operation.

Control means MVAR are able to control the oscillator VCO1 in such a way as to make the frequency of a calibration transposition signal OLV applied to this transposition stage MX1 vary beyond the upper limit of the 45 MHz-860 MHz frequency span. Specifically, a filter FBAW has been chosen whose central frequency lies a priori beyond this frequency span. The signal at the output of the filter FBAW is directed by way of the switch SW2 to an analog digital converter. Post-processing means then comprise means MP able to detect for each value of the frequency of the calibration signal, the power of the signal at the output of the bulk acoustic wave filter, and means MDT able to detect the maximum power. The central frequency Fc of the filter FBAW is then the frequency of the calibration signal corresponding to this maximum value of power.

By way of example, the means MP can calculate the power of the signal by calculating, for example, the modulus thereof. A simplified way of calculating the modulus of the signal is provided by the following formula:

$$\text{Modulus}(S) = \text{Max}(abs(S)) + \tfrac{1}{2} \text{Min}(abs(S))$$

In this formula, Max denotes the maximum value, Min denotes the minimum value and abs denotes the absolute value, S the signal delivered by the analog digital converter ADC.

By way of example, it will be assumed in the subsequent text that the central frequency Fc of the filter FBAW is equal to 1220 MHz. After the calibration phase, that is to say during normal operation, the switch SW1 is closed (FIG. 1) and the first transposition signal OL1 then has, for example, a frequency equal to 1220 MHz+Fd, where Fd denotes the frequency of the desired channel $CN_i$. Consequently, the signal at the output of the mixer MX1 is, as illustrated in FIG. 2, a signal comprising all the channels, but whose desired channel $CN_i$ is centered around the central frequency of the filter FBAW, that is to say 1220 MHz. This filter FBAW is relatively steep and consequently makes it possible to eliminate a large number of undesired adjacent channels, situated on either side of the desired channel $CN_i$.

Figure 3:
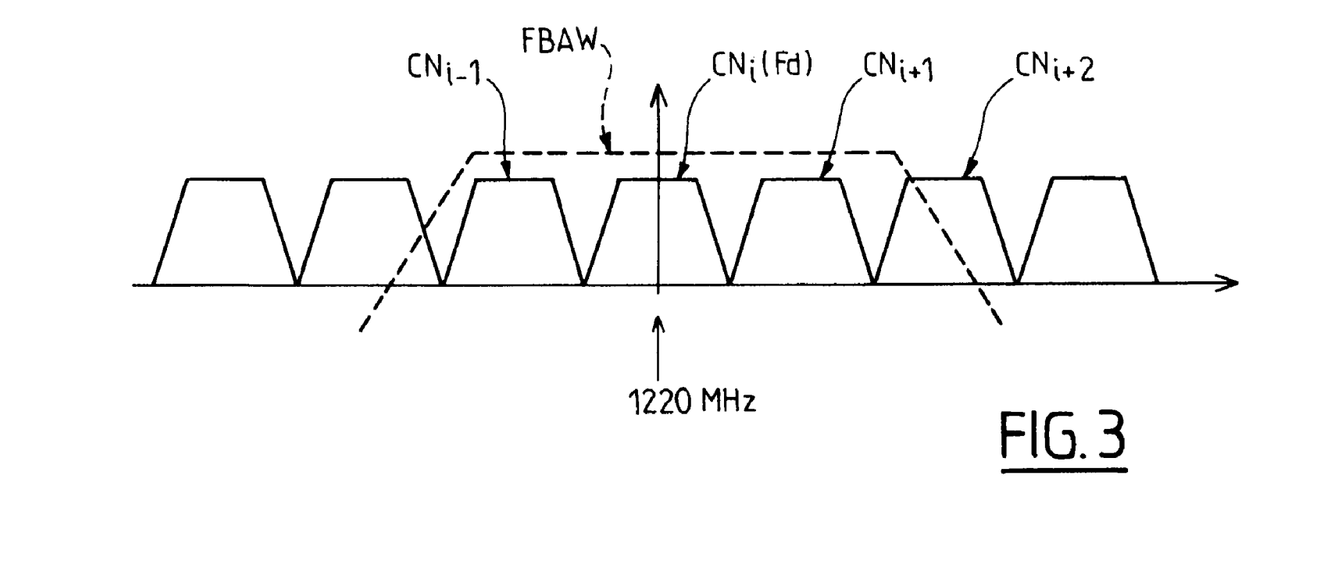
FIG. 3 diagrammatically illustrates a frequency chart of channels before and after filtering.

By way of indication, the filter FBAW can exhibit a passband of 20 MHz. Given the fact that the width of a channel is of the order of 8 MHz, the signal at the output of the filter FBAW will comprise the desired channel $CN_i$ and two or three immediately adjacent channels, as is illustrated diagrammatically also in FIG. 3.

At the output of the filter FBAW, the signal is during normal operation amplified in a controlled-gain amplifier AGC (FIG. 1; switch SW2 linking the filter FBAW and the amplifier AGC). Then, this signal undergoes a second conversion, this time a downconversion, within a second frequency transposition stage here formed of two mixers MX2I and MX2Q, respectively receiving two frequency transposition signals OL2 mutually out of phase by 90°. These frequency transposition signals OL2 emanate for example also from a voltage-controlled oscillator VCO2. The frequency of the second transposition signal OL2 is equal to the central frequency of the filter FBAW, that is to say here 1220 MHz. The second frequency transposition is therefore here of the type with zero intermediate frequency since it will bring the signal back directly to baseband. Stated otherwise, two baseband quadrature analog signals, that is to say ones exhibiting the desired channel centered around the zero frequency, are obtained at the output of the two mixers MX2I and MX2Q, on the two processing paths I and Q.

In the subsequent text, only one of the two processing paths will now be described, for example the I path, it being understood of course that the Q path exhibits an analogous structure. At the output of the mixer MX2I is disposed an analog filter FBBI whose template (frequency response) has been diagrammatically represented in FIG. 4. In this figure, the reference F1, equal to around 6 MHz, represents the frequency half-width of the channel $CN_i$. The person skilled in the art is aware that this frequency half-width F1 in fact corresponds to the theoretical frequency half-width of a channel (for example 4 MHz) multiplied by a coefficient known as "roll off", and which is for example equal to 1.35.

Figure 4:
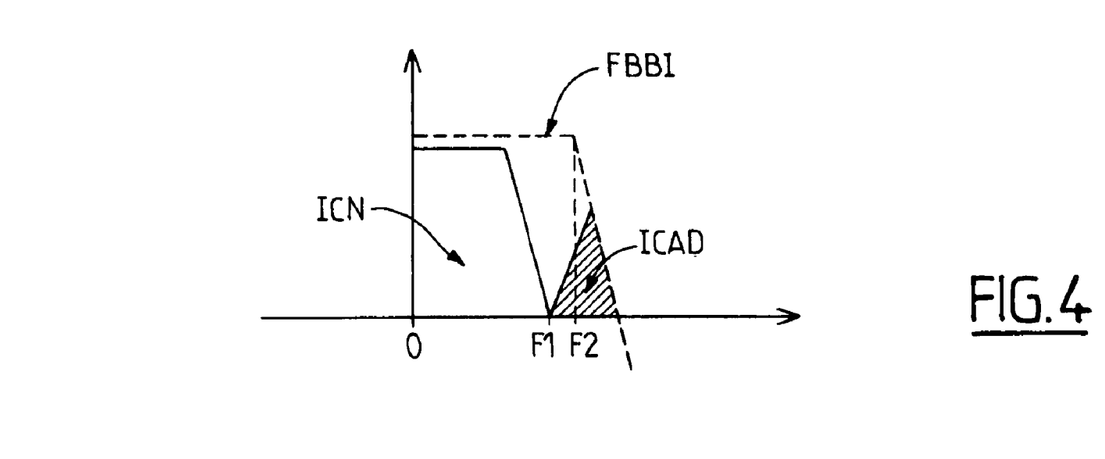
FIG. 4 diagrammatically illustrates a frequency chart of channels before and after filtering.

The baseband filter FBBI has an upper cutoff frequency equal to F2. According to the invention, this frequency F2 is chosen to be at least 20% greater than the frequency half-width F1 of the channel $CN_i$. By way of indication, it will for example be possible to choose an upper cutoff frequency F2 of each baseband filter FBB equal to around 8 MHz. Thus, a filtered signal comprising the information ICN conveyed by the selected channel, and so-called adjacent channels residual information IACD, is obtained at the output of these two baseband filters FBBI and FBBQ.

The person skilled in the art will consequently have appreciated that this analog filter, which is for example a filter of order 6, is a relatively soft filter, in the sense that it allows through information of adjacent channels. However, the use of a soft analog filter allows easy integration thereof on silicon.

The analog signals at the output of the filters FBBI and FBBQ are digitized in analog/digital converters CANI and CANQ, which exhibit for example, here a sampling frequency of the order of 100 MHz with a resolution of the order of 4 bits.

The internal structure of the digital block BNM will now be described in greater detail. In addition to the control means CTL, which may for example be embodied in software form within a microcontroller, and are intended to control the amplifier AGC, the block BNM comprises at the head end correction means MCOR intended to correct defects of phase- and amplitude-pairing of the two processing paths I and Q. Such correction means are known per se to the person skilled in the art. The latter may refer, for all useful purposes, to U.S. Pat. No. 6,044,112, or else to French Patent Application No. 02 03256 in the name of the applicant.

Figure 5:
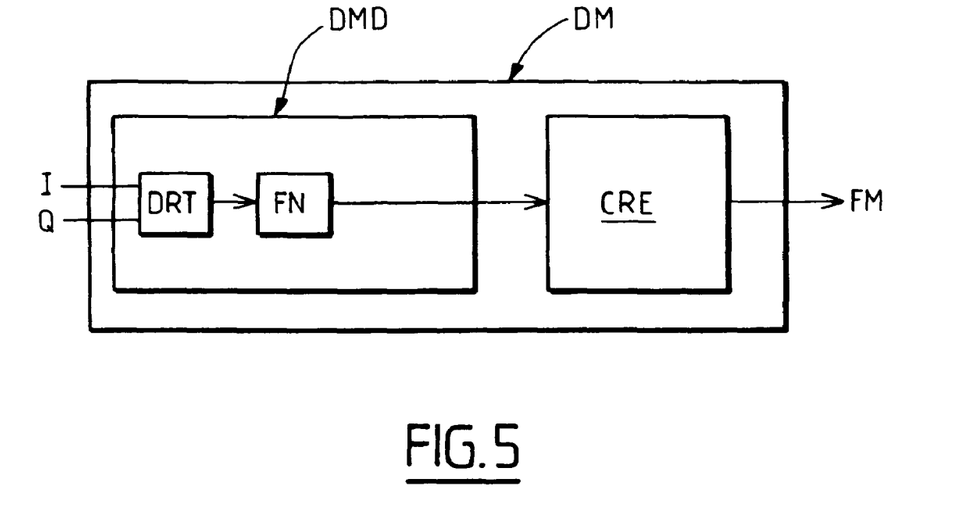
FIG. 5 diagrammatically illustrates in greater detail the internal structure of a channel decoding module of a component according to the invention.

The digital block BNM next comprises a channel decoding module DM, an example of the structure of which is illustrated more particularly in FIG. 5. More precisely, this channel decoding digital module DM comprises a stage DMD comprising demodulation means capable of performing conventional demodulation processing, followed by an error correction stage CRE performing conventional Viterbi decoding processing, deinterleaving, Reed-Solomon decoding, deshuffling, so as to deliver the packet FM that will be decoded in a source decoding block external to the component CMP, and in accordance with the MPEG standard for example. The channel decoding module also conventionally comprises a synchronization stage and an equalization stage.

The stage DMD diagrammatically also comprises at the head end correction means DRT ("Derotator") able to correct the phase noise, the frequency drift and the frequency offset of the frequency synthesizers. The correction means DRT are also used here according to the invention to compensate for the bandpass filtering FBBI, FBBQ and thus to avoid obtaining too low an error margin for the interpretation of the constellation. Such means of derotation may for example be those described in European Patent Application No. 0,481,543.

The analog filtering is here supplemented with a Nyquist filtering performed in a digital filter FN, whose cutoff frequency is equal to the frequency half-width F1 of the desired channel. The filter FN consequently supplements the filtering performed by the filter FBAW and the bandpass filter FBBI, FBBQ, and thus eliminates the information of adjacent channels.

The error correction stage CRE next performs conventional error correction processing well known to the person skilled in the art, under the terminology FEC (Forward Error Correction).

Figure 6:
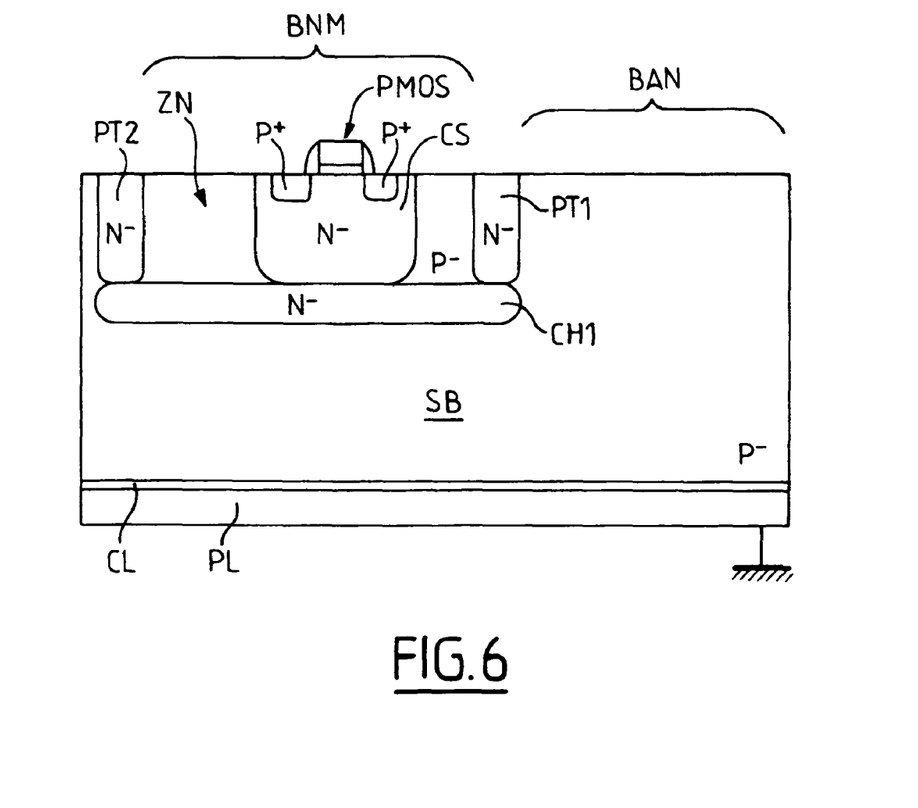
FIG. 6 diagrammatically illustrates a technological embodiment of a component according to the invention.

Technologically, the integrated circuit IC according to the invention is embodied, for example in 0.13 μm CMOS technology, on a monolithic substrate SB made of silicon, for example of P$^-$ type (FIG. 6).

To absorb the high-frequency current spikes, it is preferable to glue a metal plate PL onto the rear face of the substrate SB by means of a conventional conducting glue CL. This metal plate is intended to be grounded. The fine layer of oxide which forms naturally on the silicon of the substrate forms the dielectric of a capacitor whose two electrodes are formed respectively by the substrate SB and the metal plate PL. This capacitor, whose capacitance is relatively large, thus makes it possible to absorb the high-frequency current spikes.

Moreover, the digital part of the component CMP, that is to say in this instance the digital block BNM are made in a region ZN of the substrate which is insulated from the remainder of the substrate (in which region the analog part BAN of the component is made) by an N$^-$-doped semiconducting barrier formed here of a buried layer CH1 and two wells PT1 and PT2.

Moreover, the PMOS transistors of the digital part are made within an N$^-$ well which comes into contact with the buried layer CH1.

Also, in order to prevent the noise on the supply voltage Vdd from being transmitted via the N$^-$ wells to the analog part, so that it directly disturbs in particular the amplifier LNA and the filter FBAW, it is advantageous to bias all the N$^-$ wells with a bias voltage different from that supplying the transistors situated in this insulated region ZN of the substrate.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electronic component, comprising:
an integrated circuit embodied on a single monolithic substrate and comprising each of the following components fabricated on that single monolithic substrate:
a tuning module of the zero intermediate frequency dual upconversion then downconversion type possessing an input that receives a digital terrestrial or cable television analog signal composed of several channels and a first upconversion frequency transposition stage and a second zero intermediate frequency downconversion frequency transposition stage;
a bandpass filter of the bulk acoustic wave type disposed between the first and second frequency transposition stages and delivering a filtered analog signal containing the information conveyed by a desired channel and adjacent channels information;
a baseband filtering stage disposed on two quadrature output paths of the second zero intermediate frequency downconversion frequency transposition stage for performing a first filtering of the adjacent channels information;
a multibit analog/digital conversion stage linked to the output of the baseband filtering stage,
a digital block comprising a stage for correcting defects in phase- and amplitude-pairing of the two quadrature paths, and a channel decoding digital module (DM), linked to the output of the defects correcting stage, and comprising a demodulation stage, a digital filtering stage for eliminating the said adjacent channels information, and an error correcting stage for delivering a stream of data packets corresponding to the information conveyed by the desired channel; and
a circuit for determining the central frequency of the bulk acoustic wave filter and controlling the first upconversion frequency transposition stage in response to the determined central frequency to place the desired channel at the determined central frequency.

2. The component according to claim 1, wherein the circuit for determining comprise means in the absence of the signal at the input of the first transposition stage for varying beyond an upper limit of a frequency span of the channels the frequency of a calibration transposition signal applied to the first transposition stage, and detection means for determining for each value of the frequency of the calibration signal a power of a signal at an output of the bulk acoustic wave filter and for detecting a maximum power, the central frequency of the bulk acoustic wave filter being the frequency of the calibration signal corresponding to this maximum value of power.

3. The component according to claim 2, wherein after the determination of the central frequency of the bulk acoustic wave filter, the first frequency transposition stage is able to receive a first transposition signal having a frequency equal either to the sum of the frequency of the desired channel and of the central frequency of the filter greater than the upper limit of the frequency span, or to the difference between the central frequency and the frequency of the desired channel, and wherein the second frequency transposition stage is able to receive a second transposition signal having the said central frequency of the bulk acoustic wave filter, and wherein the passband of the bulk acoustic wave filter is of the order of two to three times the frequency width of a channel, and wherein the bandpass filtering stage possesses an upper cutoff frequency around 20% greater than the frequency half-width of a channel.

4. The component according to claim 3, wherein the passband of the bulk acoustic wave filter is of the order of 20 MHz.

5. The component according to claim 1, wherein the resolution of the analog/digital conversion stage is greater than or equal to 4 bits.

6. The component according to claim 3, wherein the sampling frequency of the analog/digital conversion stage is greater than around 2.5 times the upper cutoff frequency of the baseband filtering stage.

7. The component according to claim 6, wherein the sampling frequency of the analog/digital conversion stage is greater than 10 times the upper cutoff frequency of the baseband filtering stage.

8. The component according to claim 1, wherein the cutoff frequency of the digital filtering stage is equal to a frequency half-width of a channel.

9. The component according to claim 1, further comprising a grounding metal plate glued to a rear face of the substrate by a conducting glue.

10. The component according to claim 1, wherein the substrate has a first type of conductivity, and wherein the elements performing digital processing are disposed in a part of the substrate that is insulated from a remaining part of the substrate by a semiconducting barrier having a second type of conductivity different from the first type of conductivity, and wherein the semiconducting barrier is biased by a bias voltage different from that supplying the insulated part of the substrate.

11. The component according to claim 1 wherein the component is a receiver of digital terrestrial or cable television signals.

12. A circuit, comprising:
a single monolithic substrate onto which each of the following circuit components are fabricated:
an input receiving an analog signal including a plurality of channels;
an upconversion device to upconvert the received analog signal;
a first filter that filters the received analog signal and generates a filtered upconverted signal comprising information from a selected one of the channels and adjacent channel information;
a downconversion device to downconvert the filtered upconverted signal to an analog downconverted signal centered at zero intermediate frequency;
a second filter that filters the analog downconverted signal and generates a filtered analog downconverted signal comprising information from the selected one of the channels and less of the adjacent channel information;
a digital-to-analog converter to convert the analog downconverted signal to a digital baseband signal;
a third filter that filters the digital baseband signal and generates a filtered digital baseband signal comprising only information from the selected one of the channels; and
a calibration circuit that determines a not accurately known center frequency of the first filter and configures the upconversion device to upconvert the received analog signal such that the selected one of the channels is placed at the determined center frequency.

13. The circuit of claim 12 wherein the first filter is a bulk acoustic wave filter having, from a design perspective, the not accurately known center frequency.

14. The circuit of claim 12, the calibration circuit varying a frequency transposition signal applied to the upconversion device and determining a frequency of the varying frequency transposition signal at which maximum power passes through the bulk acoustic wave filter, that determined frequency being the center frequency.

15. The circuit of claim 12 wherein the analog signal is one of a digital terrestrial or cable television signal.

16. The circuit of claim 12 wherein the upconversion device and downconversion device comprises a zero intermediate frequency dual conversion tuner.

17. The circuit of claim 12 wherein the channels of the analog signal extend over a frequency span and wherein the upconversion device upconverts the received analog signal to a frequency that is higher than an upper limit of the frequency span.

18. The circuit of claim 12 wherein the single monolithic substrate further includes means for decoding the filtered digital baseband signal to deliver a stream of data packets corresponding to information in the selected one of the channels.

19. The circuit of claim 12, wherein the circuit is included within a digital terrestrial or cable television signal receiver box.

20. The circuit of claim 12 wherein the calibration circuit further configures the downconversion device to downconvert the filtered upconverted signal such that the selected one of the channels is placed at zero intermediate frequency.

21. The circuit of claim 12 wherein the calibration circuit further configures the downconversion device to downconvert the filtered upconverted signal such that the selected one of the channels is placed at zero intermediate frequency, the calibration circuit varying a frequency transposition signal applied to the upconversion device and determining a frequency of the varying frequency transposition signal at which maximum power passes through the first filter, that determined frequency being the center frequency.

22. The device of claim 12 wherein the first filter is a bandpass filter having a pass band of at least two times a frequency width of a channel in the analog signal.

23. The device of claim 12 wherein the second filter is a low pass filter having an upper cut-off frequency slightly greater than a frequency halfwidth of a channel in the analog signal.

24. The device of claim 12 wherein the third filter is a low pass filter having an upper cut-off frequency substantially equal to a frequency halfwidth of a channel in the analog signal.

25. A circuit comprising:
an input receiving an analog signal including a plurality of channels;
an upconversion device to upconvert the received analog signal;
a first filter that filters the received analog signal and generates a filtered upconverted signal comprising information from a selected one of the channels and adjacent channel information, wherein the first filter is a bulk acoustic wave filter having, from a design perspective, a not accurately known center frequency;
a downconversion device to downconvert the filtered upconverted signal to an analog downconverted signal centered at zero intetmediate frequency;
a second filter that filters the analog downconverted signal and generates a filtered analog downconverted signal comprising information from the selected one of the channels and less of the adjacent channel information;
a digital-to-analog converter to convert the analog downconverted signal to a digital baseband signal;
a third filter that filters the digital baseband signal and generates a filtered digital baseband signal comprising only information from the selected one of the channels; and
a calibration circuit that determines the not accurately known center frequency of the bulk acoustic wave filter and configures the upconversion device to upconvert the received analog signal such that the selected one of the channels is placed at the determined center frequency;
wherein the calibration circuit comprises:
a power measurement circuit;
a first switch to disconnect the analog signal from the upconversion device;
a second switch to connect an output of the bulk acoustic wave filter to the power measurement device; and
a control circuit that varies a frequency transposition signal applied to the upconversion device and determines a frequency of the varying frequency transposition signal at which the power measurement device measures maximum power passing through the bulk acoustic wave filter, that determined frequency being the center frequency.

26. A circuit, comprising:
an input receiving an analog signal including a plurality of channels;
an upconversion device to upconvert the received analog signal;
a filter that filters the received analog signal and generates a filtered upconverted signal comprising information from a selected one of the channels and adjacent channel information, wherein the filter, from a design perspective, has a not accurately known center frequency;
a downconversion device to downconvert the filtered upconverted signal to a downconverted signal; and
a calibration circuit that determines the not accurately known center frequency of the filter and configures the upconversion device to upconvert the received analog signal such that the selected one of the channels is placed at the determined center frequency and configures the downconversion device to downconvert the filtered upconverted signal such that the selected one of the channels is placed at zero intermediate frequency, the calibration circuit varying a frequency transposition signal applied to the upconversion device and determining a frequency of the varying frequency transposition signal at which maximum power passes through the filter, that determined frequency being the center frequency.

27. The circuit of claim 26 wherein all of the recited components of the circuit are implemented on a single integrated circuit chip.

28. The circuit of claim 26 wherein the filter is a bulk acoustic wave filter.

29. A circuit comprising:
an input receiving an analog signal including a plurality of channels;
an upconversion device to upconvert the received analog signal;
a filter that filters the received analog signal and generates a filtered upconverted signal comprising information from a selected one of the channels and adjacent channel information, wherein the filter, from a design perspective, has a not accurately known center frequency;
a downconversion device to downconvert the filtered upconverted signal to a downconverted signal; and
a calibration circuit that determines the not accurately known center frequency of the filter and configures the upconversion device to upconvert the received analog signal such that the selected one of the channels is placed at the determined center frequency and configures the downconversion device to downconvert the filtered upconverted signal such that the selected one of the channels is placed at zero intermediate frequency;
wherein the calibration circuit comprises:
a power measurement device;
a first switch to disconnect the analog signal from the upconversion device;
a second switch to connect an output of the filter to the power measurement device; and
a control circuit that varies a frequency transposition signal applied to the upconversion device and determines a frequency of the varying frequency transposition signal at which the power measurement device measures maximum power passing through the filter, that determined frequency being the center frequency.

30. A method for processing an analog signal including a plurality of channels;
upconverting the received analog signal;
filtering the upconverted received analog signal to generate a filtered upconverted signal comprising information from a selected one of the channels and adjacent channel information, wherein filtering comprises filtering with a filter that, from a design perspective, does not have an accurately known center frequency;
downconverting the filtered upconverted signal to a downconverted signal;
determining the not accurately known center frequency of the filter by:
varying a frequency transposition signal applied to effectuate upconverting; and
determining a frequency of the varying frequency transposition signal at which the power measurement device measures maximum power passing through the filter, that determined frequency being the center frequency;
configuring upconverting to upconvert the received analog signal such that the selected one of the channels is placed at the determined center frequency and configuring downconverting to downconvert the filtered upconverted signal such that the selected one of the channels is placed at zero intermediate frequency.

31. A method for processing an analog signal including a plurality of channels, comprising:
upconverting the received analog signal;
filtering the upconverted received analog signal to generate a filtered upconverted signal comprising information from a selected one of the channels and adjacent channel information, wherein filtering comprises filtering with a filter that, from a design perspective, does not have an accurately known center frequency;
downconverting the filtered upconverted signal to a downconverted signal;
determining the not accurately known center frequency of the filter;
configuring upconverting to upconvert the received analog signal such that the selected one of the channels is placed at the determined center frequency and configuring downconverting to downconvert the filtered upconverted signal such that the selected one of the channels is placed at zero intermediate frequency:
wherein determining comprises:
disconnecting the analog signal from being upconverted;
connecting an output of the filter to a power measurement device;
varying a frequency transposition signal applied to effectuate upconverting; and
determining a frequency of the varying frequency transposition signal at which the power measurement device measures maximum power passing through the filter, that determined frequency being the center frequency.

32. A method for processing an analog signal including a plurality of channels;
upconverting the received analog signal;
first filtering the upconverted received analog signal to generate a filtered upconverted signal comprising information from a selected one of the channels and adjacent channel information, wherein first filtering comprises filtering with a filter that, from a design perspective, does not have an accurately known center frequency;
downconverting the filtered upconverted signal to an analog downconverted signal centered at zero intermediate frequency;
second filtering the analog downconverted signal to generate a filtered analog downconverted signal comprising information from the selected one of the channels and less of the adjacent channel information;
converting the analog downconverted signal to a digital baseband signal; and
third filtering the digital baseband signal to generate a filtered digital baseband signal comprising only information from the selected one of the channels; and
determining the not accurately known center frequency of the filter by:
varying a frequency transposition signal applied to effectuate upconverting; and
determining a frequency of the varying frequency transposition signal at which the power measurement device measures maximum power passing through the filter, that determined frequency being the center frequency.

33. The method of claim 32, the method further comprising:
configuring upconverting to upconvert the received analog signal such that the selected one of the channels is placed at the determined center frequency.

34. The method of claim 32 wherein the channels of the analog signal extend over a frequency span and wherein upconverting upconverts the received analog signal to a frequency that is higher than an upper limit of the frequency span.

35. The method of claim 32 further including decoding the filtered digital baseband signal to deliver a stream of data packets corresponding to information in the selected one of the channels.

36. The method of claim 32 wherein first filtering comprises bandpass filtering with a pass band of at least two times a frequency width of a channel in the analog signal.

37. The method of claim 32 wherein second filtering comprises low pass filtering with an upper cut-off frequency slightly greater than a frequency halfwidth of a channel in the analog signal.

38. The method of claim 32 wherein third filtering comprises low pass filtering with an upper cut-off frequency substantially equal to a frequency halfwidth of a channel in the analog signal.

39. A method for processing an analog signal including a plurality of channels;
upconverting the received analog signal;
first filtering the upconverted received analog signal to generate a filtered upconverted signal comprising information from a selected one of the channels and adjacent channel information;
downconverting the filtered upconverted signal to an analog downconverted signal centered at zero intermediate frequency;
second filtering the analog downconverted signal to generate a filtered analog downconverted signal comprising information from the selected one of the channels and less of the adjacent channel information;
converting the analog downconverted signal to a digital baseband signal; and
third filtering the digital baseband signal to generate a filtered digital baseband signal comprising only information from the selected one of the channels;
wherein first filtering comprises filtering with a filter that, from a design perspective, does not have an accurately known center frequency, the method further comprising:
determining the not accurately known center frequency of the filter; and
configuring upconverting to upconvert the received analog signal such that the selected one of the channels is placed at the determined center frequency;
wherein determining comprises:
disconnecting the analog signal from being upconverted operation;
connecting an output of the filter to a power measurement device;
varying a frequency transposition signal applied to effectuate upconverting; and
determining a frequency of the varying frequency transposition signal at which the power measurement device measures maximum power passing through the filter, that determined frequency being the center frequency.

* * * * *

UNITED STATES PATENT AND TRADEMARK OFFICE
CERTIFICATE OF CORRECTION

| | | |
|---|---|---|
| PATENT NO. | : 7,796,197 B2 | Page 1 of 1 |
| APPLICATION NO. | : 10/819086 | |
| DATED | : September 14, 2010 | |
| INVENTOR(S) | : Busson et al. | |

It is certified that error appears in the above-identified patent and that said Letters Patent is hereby corrected as shown below:

With regard to Claim 25:

Column 11, Line 21, please replace the word "intetmediate" with the following:

-- intermediate --

Signed and Sealed this
Tenth Day of May, 2011

David J. Kappos
*Director of the United States Patent and Trademark Office*